(12) United States Patent
Oda

(10) Patent No.: US 6,373,314 B2
(45) Date of Patent: Apr. 16, 2002

(54) CLOCK GENERATOR AND DIGITAL OR TELEPHONE PORTABLE TERMINAL USING THE SAME

(75) Inventor: Toshiyuki Oda, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/750,797

(22) Filed: Jan. 2, 2001

(30) Foreign Application Priority Data

Jun. 1, 2000 (JP) ........................................ 2000-005785

(51) Int. Cl.$^7$ ............................... G06F 1/64; H03K 3/00
(52) U.S. Cl. ........................ 327/291; 327/106; 327/157
(58) Field of Search ................................ 327/105–107, 327/141, 142, 143, 147, 148, 150, 155–157, 159, 291, 292, 294; 455/76, 522, 574; 375/374–376; 331/17

(56) References Cited

U.S. PATENT DOCUMENTS

| | | | |
|---|---|---|---|
| 5,783,972 A | * | 7/1998 | Nishikawa .................. 331/17 |
| 5,793,819 A | * | 8/1998 | Kawabata .................. 375/344 |
| 5,856,766 A | * | 1/1999 | Gillig et al. ................ 331/176 |
| 5,859,570 A | * | 1/1999 | Itoh et al. .................. 327/106 |
| 5,900,751 A | | 5/1999 | Kuwabara ................... 327/113 |
| 6,223,061 B1 | * | 4/2001 | Dacus et al. ................ 455/574 |

FOREIGN PATENT DOCUMENTS

| | | |
|---|---|---|
| EP | 2 249 004 A | 4/1992 |
| JP | 7-202737 | 8/1995 |
| JP | 8-251019 | 9/1996 |
| JP | 9-199997 | 7/1997 |
| JP | 9-326752 | 12/1997 |
| JP | 10-284997 | 10/1998 |
| JP | 11-355102 | 12/1999 |

OTHER PUBLICATIONS

European Search Report dated Jul. 27, 2001.

* cited by examiner

Primary Examiner—My-Trang Nu Ton
(74) Attorney, Agent, or Firm—McGinn & Gibb, PLLC (57) ABSTRACT

A clock generator for a multi-system comprising a TCXO (temperature compensated crystal oscillator) 1 controlled by an AFC (automatic frequency control) circuit 12 and a sub-system operative with a system clock supplied from the main system and including a PLL (phase locked loop) circuit having a phase comparator 5 and a VCO (voltage controlled oscillator) 3 is disclosed. The frequency division ratios of frequency dividers 2, 4 in the PLL circuit is compensated on the basis of the output of the AFC circuit 12 to absorb phase changes due to the AFC circuit 12.

6 Claims, 6 Drawing Sheets

(a) TCXO CHARACTERISTIC (b) D/A CHARACTERISTIC (c) VCO CHARACTERISTIC

CLOCK GENERATOR AND DIGITAL OR TELEPHONE PORTABLE TERMINAL USING THE SAME

BACKGROUND OF THE INVENTION

This application claims benefit of Japanese Patent Application No. 2000-005785 filed on Jan. 6, 2000, the contents of which are incorporated by the reference.

The present invention relates to clock generators and, more particularly, to clock generators for reference clock generation in digital portable telephone terminals or the like.

Portable telephone or like radio communication terminals require an accurate and highly stable clock as a reference of operation of their component circuits. Such a portable telephone terminal has a circuit for controlling the frequency of an oscillator (for instance crystal oscillator) of its own clock generator to match received wave from a base station. This circuit is well known as AFC (Automatic Frequency Control) circuit. Prior art examples of the AFC circuits are disclosed in, for instance, Japanese Patent Laid-Open No. 9-199997 and Japanese Patent Laid-Open No. 10-284997. Prior art example of the receiver using such a clock generator is disclosed in, for instance, Japanese Patent Laid-Open No. 7-202737. Prior art example of the PLL (Phase Locked Loop) is disclosed in, for instance, Japanese Patent Laid-Open No. 8-251019.

Figure 6:
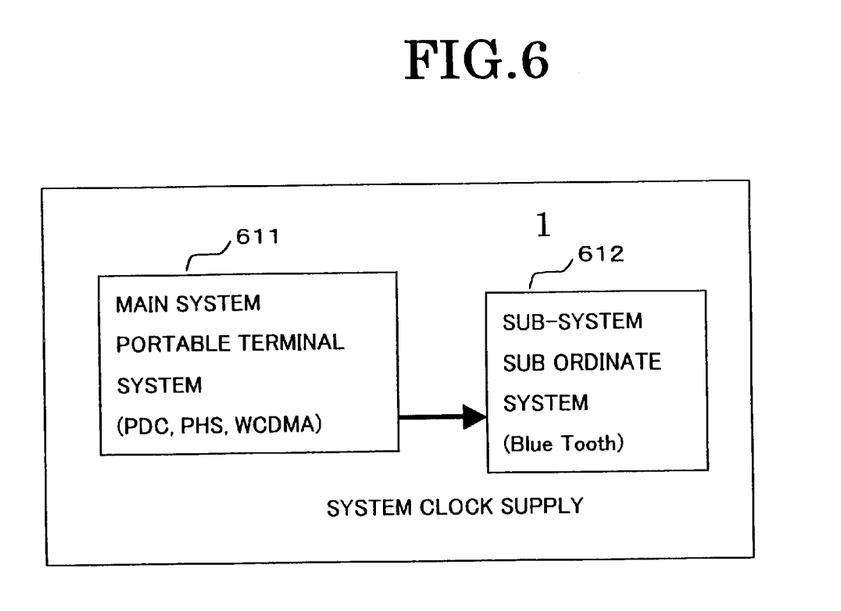
FIG. 6 shows an example of general terminal including a main system and a sub-system.

A multi-system terminal or the like employing a system using a clock controlled by an AFC circuit (hereinafter referred to as main system), also employs a coexistent system utilizing the frequency of a crystal oscillator or the like (hereinafter referred to as sub-system). FIG. 6 shows an example of such terminal. As shown, the terminal comprises a main system 611 and a sub-system 612 receiving a system clock supplied therefrom. The main system 611 is a current PDC or a next era WCDMA system for portable terminal (i.e., portable telephone terminal). Alternatively, the main system 611 may be PHS (Personal Handy phone System). The sub-system 612 is subordinate to such main system and may, for instance, be a blue tooth system.

In the portable telephone terminal, the reference clock generator should be very highly accurate. As reference clock generator, usually a TCXO (temperature compensated crystal oscillator) is used. In the multi-system, the use of a TCXO in each system is undesired, and particularly disadvantageous in portable remote terminals which are demanded to be small in size and light in weight, because of increase of components. Accordingly, as shown in the block diagram of FIG. 7, a TCXO 70 is provided in the sole main system, and its output clock is used in the plurality of PLL circuits, i.e., a radio terminal side PLL circuit (first PLL circuit) 71, a control circuit clock generator 72 (second PLL circuit) for main system control PLL and a blue tooth clock generator (third PLL circuit) 73 for sub-system ratio or control part PLL.

Figure 8:
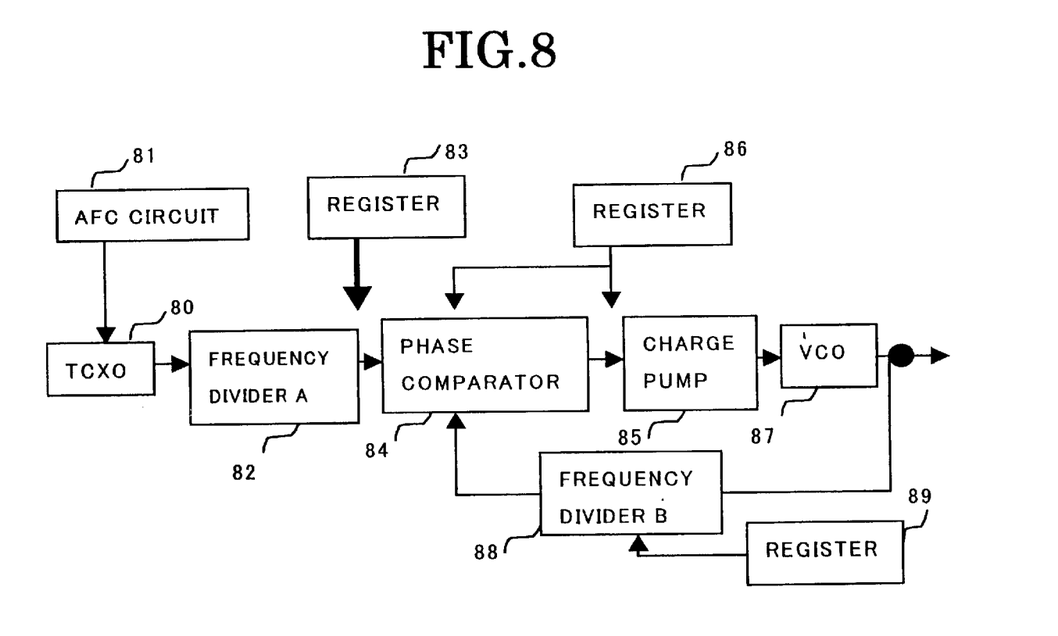
FIG. 8 is a block diagram showing a general PLL circuit.

FIG. 8 is a block diagram showing a general PLL circuit. This circuit comprises a TCXO 80, an AFC circuit 81, a frequency divider A82, registers 83, 86 and 89, a phase comparator 84, a charge pump 85, a VCO (Voltage Controlled Oscillator) 87 and a frequency divider B 88. The registers 83 and 89 control the frequency division ratios of the frequency dividers A82 and B82, respectively. The register 86 controls the phase compensator 84 and the charge pump 85. The circuit having this PLL construction operates such that the value obtained by the division of the output frequency fr of the TCXO 80 by the frequency division ratio Da of the frequency divider A82 becomes equal to the value obtained by the division of the output frequency fo of the VCO 87 by the frequency division ratio Db of the frequency divider B 88. That is, $$fr/Da = fo/Db \qquad (1).$$

The equation (1) can be changed to the following equation (2).

$$fo = fr \times Da/Db \qquad (2).$$

As a result, the output of the VCO 87 is determined by multiplying the output frequency of TCXO 80 with division ratios of the both frequency divider 82 and 88. An output at a desired frequency thus can be obtained by varying the frequency division ratios with the registers 83 and 89.

Figure 9:
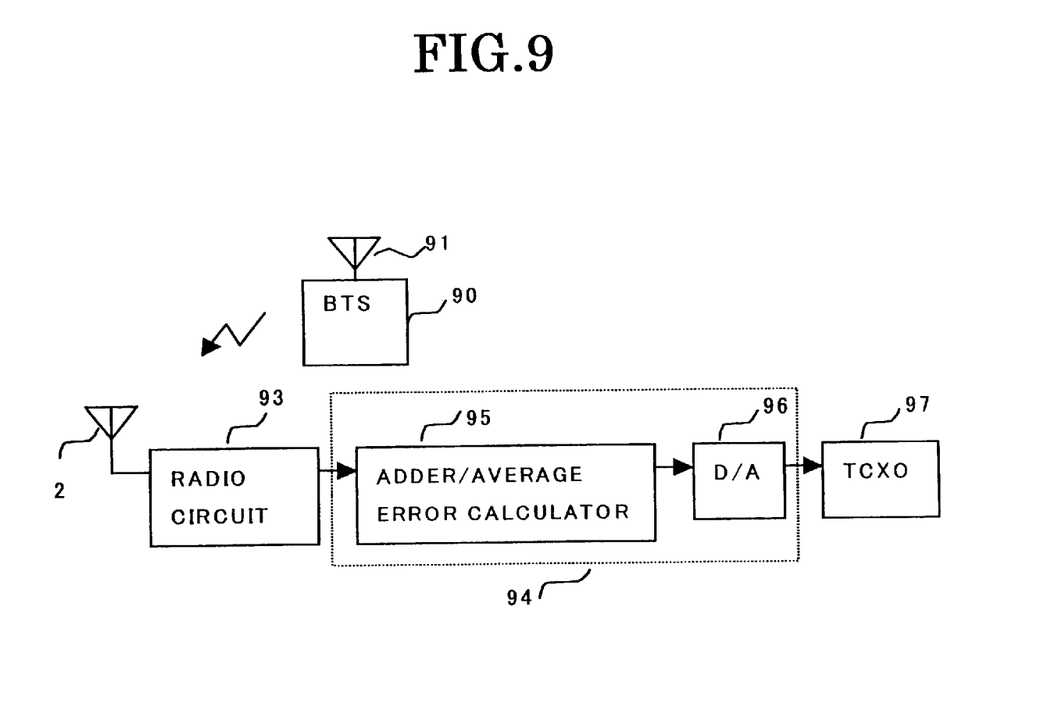
FIG. 9 is a circuit construction for realizing the AFC function.

The general AFC function of, for instance, a portable telephone terminal will now be described with reference to FIG. 9. The function is to synchronize the terminal to received wave from a BTS (Base Transcriber Station). The system shown in FIG. 9 comprises a BTS 90 having an antenna 91, an antenna 92, a radio circuit 93, an AFC circuit 94 including an adder/average error calculator circuit 95 and a D/A (digital-to-analog) circuit 96 and a TCXO 97.

The received wave from the BTS 90 varies instantaneously due to such cause as fading in the propagation path. The AFC circuit 94 is adapted to provide synchronization to the received wave even in such a case. The radio unit 93 demodulates the high frequency wave received from the BTS 90 to provide a base band output. The adder/average error calculator circuit 95 in the AFC circuit 94 calculates a phase error, and the D/A converter 96 D/A converts the phase error and feeds out the resultant analog voltage to the TCXO 97.

Figure 7:
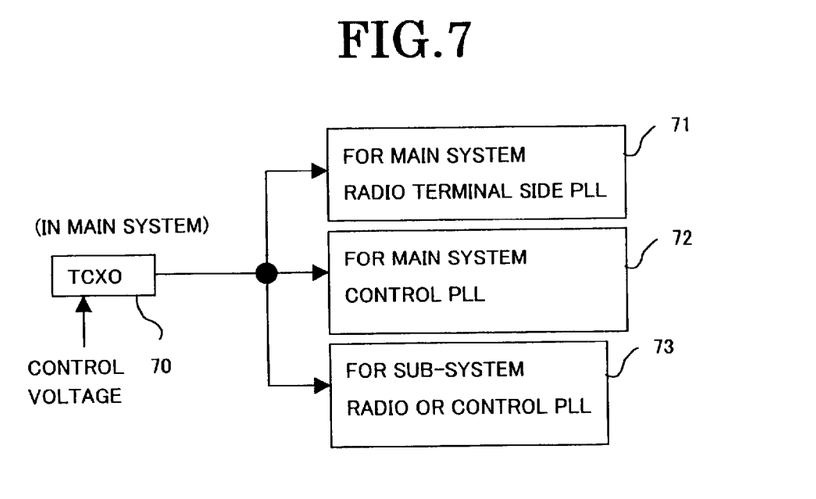
FIG. 7 is a block diagram of the clock generator in the system shown in FIG. 6.

In the system shown in FIG. 7, the clock of the sub-system (Blue Tooth) PLL should not be subject to variation. However, as disclosed the foregoing, the reference frequency change of the TCXO 80 by the AFC circuit 81 causes the corresponding change in the output frequency of the VCO 87. As noted above, the frequency variations are undesired in the sub-system (because of resultant adverse effects on the circuit operation, and the sub-system is desired to use a clock free from the influence of the AFC function, which is used in the main system, for instance.

SUMMARY OF THE INVENTION

The present invention accordingly has an object of providing a clock generator, which is used for a system having a main system and a sub-system and permits the sub-system to generate a clock free from the influence of AFC function used in the main system.

According to an aspect of the present invention, there is provided a clock generator for a multi-system comprising a TCXO (temperature compensated crystal oscillator) controlled by an AFC (automatic frequency control) circuit and a sub-system operative with a system clock supplied from the main system and including a PLL (phase locked loop) circuit having a phase comparator and a VCO (voltage controlled oscillator), wherein: the frequency division ratio of a frequency divider in the PLL circuit is compensated on the basis of the output of the AFC circuit to absorb phase changes due to the AFC circuit.

The frequency divider in the PLL circuit controlled by the AFC circuit is a first frequency divider for frequency dividing the output of the TCXO. The frequency divider in the PLL circuit controlled by the AFC circuit is a second frequency divider for frequency dividing the output of the VCO. The clock generator further comprises a register for changing the frequency division ratio of the frequency divider according to phase changes in the AFC circuit. The clock generator further comprises a temperature sensor for detecting the temperature of the TCXO and a memory for storing detected temperature data obtained in the temperature sensor and characteristic change data of the TCXO, data stored in the memory being referred to at the time of the frequency division ratio compensation on the basis of the output of the AFC circuit. The clock generator further comprises a charge pump including a pulse waveform compensating circuit provided at the preceding stage to the VCO.

According to another aspect of the present invention, there is provided a clock generator comprising a TCXO (temperature compensated crystal oscillator) controlled by an AFC (automatic frequency control) circuit, a first frequency divider for frequency dividing the output of the TCXO, a phase comparator for receiving the output of the first frequency divider as one input, a charge pump for receiving the output of the phase comparator, a VCO (voltage controlled oscillator) for feeding out an oscillation frequency according to the output voltage of the charge pump, a second frequency divider for frequency dividing the output of the VCXO and feeding out the result of the frequency division as the other input to the phase comparator, and a temperature sensor for detecting the temperature of the TCXO, the AFC circuit executing control of the TCXO on the basis of the detected temperature in the temperature sensor and frequency change data of the TCXO.

According to other aspect of the present invention, there is provided a digital portable terminal or a portable telephone terminal including the clock generator defined in the foregoing.

The clock generator according to the present invention finds application to a terminal having two coexistent systems, i.e., a main system and a sub-system (hereinafter referred to as multi-system), in which the system clock of the sub-system is generated with reference to the system clock of the main system, and has an effect that a stable system clock can be supplied to the sub-system canceling system clock changes which may occur due to the main system AFC function.

Other objects and features will be clarified from the following description with reference to attached drawings.

PREFERRED EMBODIMENTS OF THE INVENTION

Preferred embodiments of the present invention will now be described with reference to the drawings.

Figure 1:
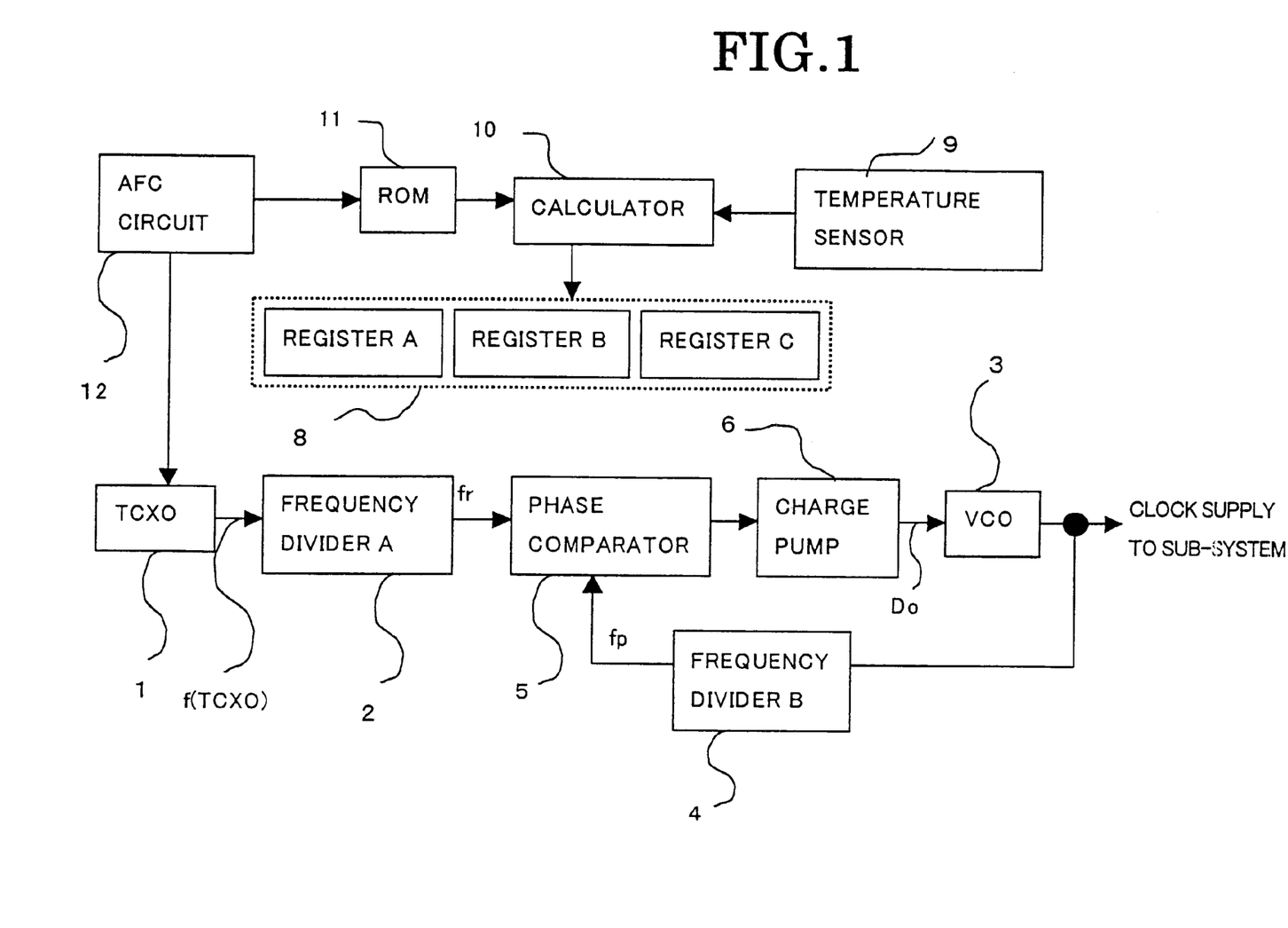
FIG. 1 is a block diagram showing the circuit construction of a preferred embodiment of clock generator according to the present invention.

FIG. 1 is a block diagram showing the circuit construction of a preferred embodiment of clock generator according to the present invention. The clock generator comprises a TCXO 1, a frequency divider A (first frequency divider) 2, a VCO 3, a frequency divider B (second frequency divider) 4, a phase comparator 5, a charge pump 6, a register (i.e., registers A to C) 8, a temperature sensor 9, a calculator 10, a ROM (Read Only Memory) 11 and an AFC circuit 12. The TCXO 1 receives the output of the AFC circuit 12, and feeds out its oscillation output f (TCXO) to the frequency divider A2. The frequency divider A2 feeds out its frequency division output fr to one input terminal of the phase comparator 5. The frequency divider B4 frequency divides the output of the VCO 3, and feeds out its frequency division output fp to the other input terminal of the phase comparator 5. The phase comparator 5 compares the phases of the two frequency division outputs fr and fp. The calculator 10 performs calculation on the output signal from the temperature sensor 9 and the output signal fed out from the AFC circuit 12 via the ROM 11, and feeds out the calculation result to the registers 8.

Figure 2:
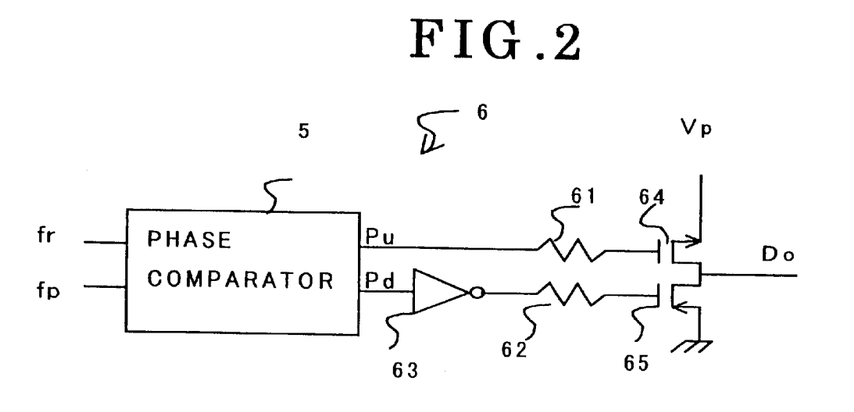
FIG. 2 shows a construction example of charge pump 6 together with the preceding stage phase comparator 5 in the clock generator 1 shown in FIG. 1.

FIG. 2 shows a construction example of charge pump 6 together with the preceding stage phase comparator 5 in the clock generator 1 shown in FIG. 1. The charge pump 6 in this example has a pair of resistors 61 and 62, an inverter (i.e. phase inverting circuit) 63 connected to the input terminal of the resistor 62, and pair of compensation MOS transistors 64 and 65, which are serially connected between the power supply and the ground and have their gates connected to the output terminals of the resistors 61 and 62, respectively. The phase comparator 5 receives the frequency division outputs fr and fp from the frequency dividers A2 and B4, and generates a pump-up and a pump-down signal pu and pd. The pump-up and -down signals pu and pd are fed out to the input terminals of the resistor 61 and the inverter 63, respectively. The MOS transistors 64 and 65 are thus on-off operated to obtain an output signal Do from their common drain juncture. The output signal Do is fed out to the VCO 3 shown in FIG. 1 for oscillation frequency control of the VCO.

Figure 3:
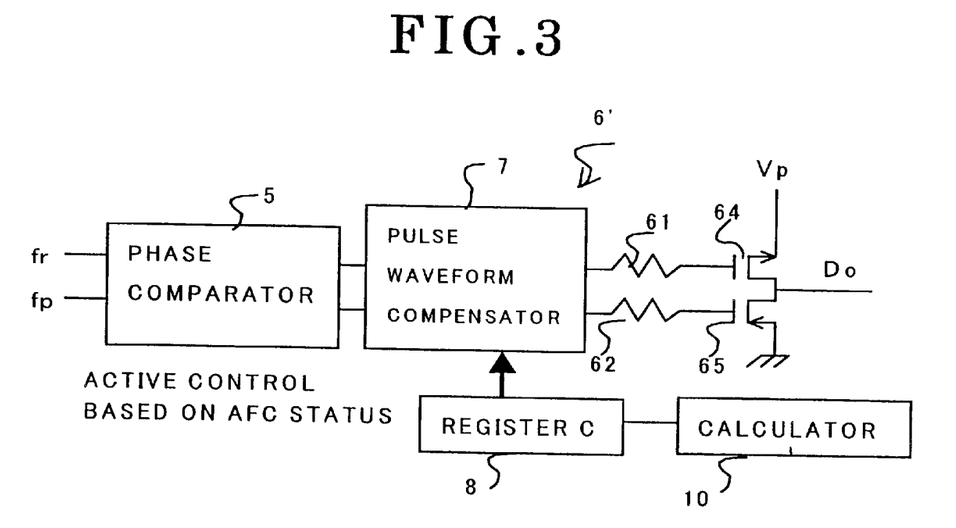
FIG. 3 shows a different example of charge pump 6' together with the preceding stage phase comparator 5 as shown in FIG. 1.

FIG. 3 shows a different example of charge pump 6' together with the preceding stage phase comparator 5 as shown in FIG. 1. The charge pump 6' has a pulse waveform compensating circuit 7, a pair of resistors 61 and 62 and a pair of compensation MOS transistors 64 and 65. The pulse waveform compensating circuit 7 is controlled by the output of the register C in the register 8 receiving the output of the calculator 10 shown in FIG. 1, and feeds out a phase compensation (or differential) pulse output to the input terminals of the resistors 61 and 62.

The operation of the above clock generator shown in FIGS. 1 to 3 according to the present invention will now be described. The frequency divider A2, the frequency division ratio of which is determined by a preset value from the register A in the register 8, frequency divides the oscillation output from the TCXO 1, and feeds out its output signal fr to one input terminal of the phase comparator 5. The TCXO 1 receives and is controlled by the output of the AFC circuit 12. Thus, a case will now be considered, in which the oscillation frequency of the TCXO 1 undergoes changes due to the AFC function. If the output frequency of the TCXO 1 corresponding to the D/A converter output is known, changes in the output frequency of the TCXO 1 can be cancelled. The temperature sensor 9 always senses the temperature of the TCXO 9. The characteristic of the TCXO 1 in a predetermined temperature range is stored in the ROM 11. Phase compensation data of the AFC circuit 12 is registered by positive re-writing in the register 8.

Figure 4:
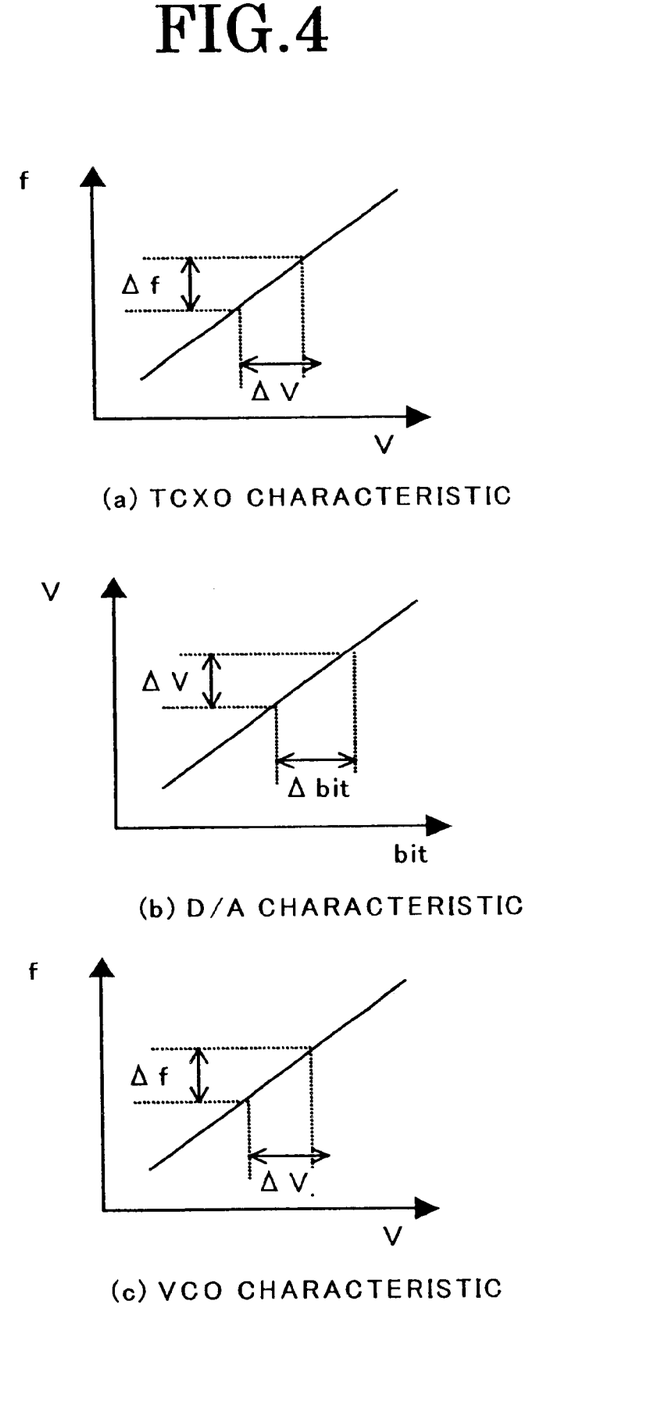
FIGS. 4(a)–4(c) are the graph of V-f (voltage versus frequency) characteristic of the TCXO 1, input bits versus voltage characteristic of the D/A converter and the V-f characteristic of the VCO 3.

If f (TCXO)/N=fr, M in f' (TCXO)/Mfr for f' (TCXO) corresponding to the output frequency of the TCXO 1 undergoing changes can be determined by calculation. Graphs of FIG. 4 for describing the operation will now be referred to. FIG. 4(a) is the graph of V-f (voltage versus frequency) characteristic of the TCXO 1. FIG. 4(b) is the graph of input bits versus voltage characteristic of the D/A converter. FIG. 4(c) is the V-f characteristic of the VCO 3. It will be seen that the V-f and other characteristics of the TCXO 1, the D/A converter and the VCO 3 are substantially linear. Accordingly, D/A converter control values around the AFC control are stored in the ROM 11. Then, when the D/A converter control value for controlling the TCXO 1 is changed by the output control signal from the AFC circuit 12, the corrected value is written in the frequency division ratio register A.

The same result is also obtainable by controlling the value of the frequency divider B4 in lieu of the frequency divider A2. Specifically, the frequency divider B4 executes frequency division according to a preset value in the register B in the register 8. If the frequency of the TCXO 1 is subject to changes, it is possible to derive M' given as (TCXO)/N= f(VCO)/M' by calculation provided f(TCXO)/N=f(VCO)/M. The V-f characteristic of the VCO 3 as shown in FIG. 4(c) is thus obtainable. It is thus possible to realize the same control as described above.

Like the above case, when a frequency change of the TCXO 1 occurs, the frequency dividers A2 and B2 are no longer in phase, and thus the charge pump 6 functions to bring these frequency dividers in in-phase relation to each other. In the case of frequency variations due to the AFC function, however, it is possible to control the output of the VCO 3 to be constant by writing the result of calculation in the calculator 10 in the register C in the register 8 and correcting the control voltage of the VCO 3 with actual pulse duration change caused by the pulse waveform compensating circuit 7 shown in FIG. 3.

Figure 5:
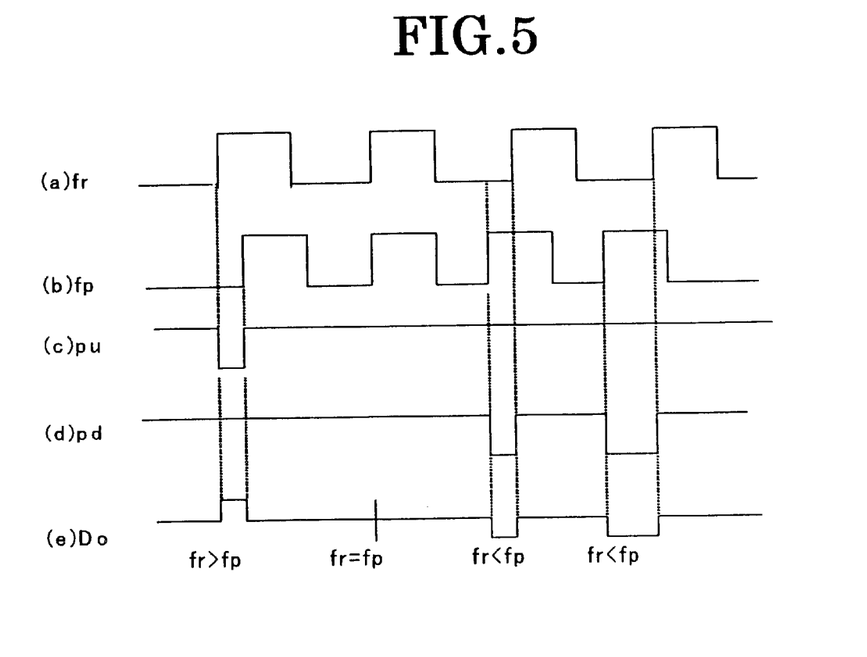
FIG. 5 is a view for describing the operation of the charge pump 6 shown in FIGS. 1 to 3.

FIG. 5 is a view for describing the operation of the charge pump 6 shown in FIGS. 1 to 3. In the Figure, labeled (a) is the output pulse signal fr of the frequency divider A2, (b) the output pulse signal fp of the frequency divider B4, (c) is the pump-up signal pu from the phase comparator 5, (d) the pump-down signal pd therefrom, and (e) the output pulse signal Do from the charge pump 6. The output pulse signal Do is fed out to the VCO 3 for controlling the frequency thereof. When the signal fr is leading the signal fp in phase, pu and pd are "low" and "high", respectively, and positive voltage "high" is fed out as Do. When the signal fr is lagging in phase behind the signal fp, on the other hand, pu and pd are "high" and "low", respectively, and negative voltage "low" is fed out as Do. When the signals fr and fp are in phase, the output pulse signal Do of the charge pump 6 is zero.

When using the charge pump 6' including the pulse waveform compensating circuit 7 as shown in FIG. 3, the pulse durations of the pump-up and -down signals pu and pd are controlled according to the control extent of AFC.

As has been made obvious from the foregoing, the clock generator according to the present invention has a pronounced practical effect that it is possible to supply a system clock at a stable frequency to the sub-system, which receives its system clock from the main system, irrespective of the AFC function provided in the main system.

Changes in construction will occur to those skilled in the art and various apparently different modifications and embodiments may be made without departing from the scope of the present invention. The matter set forth in the foregoing description and accompanying drawings is offered by way of illustration only. It is therefore intended that the foregoing description be regarded as illustrative rather than limiting.

What is claimed is:

1. A portable telecommunication terminal, comprising:

an automatic frequency circuit (AFC) that receives a radio telecommunication signal, determines a phase error, provides a phase error signal to a digital-to-analog (D/A) converter, and writes a correction value to a first frequency division ratio register when a value of the D/A converter is changed;

a signal temperature compensated crystal oscillator (TXCO) that receives a signal corresponding to the phase error signal of the D/A converter and provides an output frequency to a first frequency divider having a first frequency division ratio, $D_a$, determined by the first frequency division ratio register, the first frequency divider providing an output signal, $f_r$; and a voltage controlled oscillator (VCO) having an output frequency, $f_o$, that provides a sub-system clock, which is substantially invariant to the phase error, and substantially equals the output frequency of the TXCO multiplied by a ratio of the first frequency division ratio, $D_a$, of the first frequency divider and a second frequency division ratio, $D_b$, of a second frequency divider such that, $f_0=f_r (D_a/D_b)$.

2. The portable telecommunication terminal according to claim 1, wherein:

the second frequency divider that divides the output frequency, $f_o$, of the VCO by the second frequency division ratio, $D_b$, which is determined by a second frequency division ratio register, wherein a preset value of the second frequency division ratio register changes inversely with a change in the output frequency of the TXCO.

3. The portable telecommunication terminal according to claim 2, further comprising:

a phase comparator having as inputs the output signal, $f_r$, of the first frequency divider and an output signal, $f_p$, of the second frequency divider; and a charge pump that receives an output of the phase comparator and provides an output signal, $D_o$, to the VCO.

4. The portable telecommunication terminal according to claim 3, wherein the charge pump includes a pair of complimentary metal oxide semiconductor (MOS) transistors connected in series between power and ground, having a common drain juncture that provides the output signal, $D_o$, to the VCO, wherein a gate of one of the pair of complementary MOS transistors is connected to a pump-up signal outputted from the phase comparator and another gate of another one of the pair of complementary MOS transistors is connected through an inverter to a pump-down signal outputted from the phase comparator.

5. The portable telecommunication terminal according to claim 3, wherein the charge pump receives a compensating signal from a pulse waveform compensator, which receives a stored calculation result from a calculator based on a frequency change caused by the AFC and provides a correcting control voltage to the VCO by changes in pulse duration.

6. The portable telecommunication terminal according to claim 1, further comprising:

a temperature sensor for detecting a temperature of the TXCO;

a read only memory (ROM) that stores characteristics of the TXCO for a temperature range;

a calculator that calculates a result based on an output of the temperature sensor and the characteristics of the TXCO, the result being referred to by a frequency division ratio register when the AFC provides an output.

* * * * *